US010043599B2

(12) United States Patent
Hayashishita et al.

(10) Patent No.: US 10,043,599 B2
(45) Date of Patent: Aug. 7, 2018

(54) MULTI-CORE CABLE

(71) Applicant: SUMITOMO ELECTRIC INDUSTRIES, LTD., Osaka-shi, Osaka (JP)

(72) Inventors: Tatsunori Hayashishita, Aomori (JP); Yuuki Isoya, Aomori (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 15/133,540

(22) Filed: Apr. 20, 2016

(65) Prior Publication Data

US 2016/0314873 A1 Oct. 27, 2016

(30) Foreign Application Priority Data

Apr. 24, 2015 (JP) ................................ 2015-089348

(51) Int. Cl.
*H01B 7/295* (2006.01)
*H01B 3/40* (2006.01)
(Continued)

(52) U.S. Cl.
CPC ............... *H01B 3/40* (2013.01); *H01B 1/023* (2013.01); *H01B 1/026* (2013.01); *H01B 3/305* (2013.01); *H01B 3/306* (2013.01); *H01B 3/441* (2013.01); *H01B 11/20* (2013.01); *H01B 7/1895* (2013.01); *H01B 11/183* (2013.01)

(58) Field of Classification Search
USPC .......................................................... 174/107
See application file for complete search history.

(56) References Cited

U.S. PATENT DOCUMENTS 2,056,085 A * 9/1936 Alles .................... G01M 3/181
174/105 R
3,600,674 A * 8/1971 Roberts .................... F17D 5/06
174/11 R (Continued)

FOREIGN PATENT DOCUMENTS

DE 102012000935 A1 * 7/2013 ........... H01B 11/005
JP 2008-171778 A 7/2008
JP 2008171778 A * 7/2008

*Primary Examiner* — William H Mayo, III
*Assistant Examiner* — Krystal Robinson
(74) *Attorney, Agent, or Firm* — Drinker Biddle & Reath LLP

(57) ABSTRACT

A multi-core cable includes at least two coaxial wire pairs, each of the coaxial wire pairs including two coaxial wires being arranged side by side in contact with each other, each of the coaxial wires including a center conductor, an insulator, an outer conductor and a jacket, the outer conductor including an inner layer portion formed by thin metal wires being helically wrapped, and an outer layer portion formed by a metal resin tape being helically wrapped around the inner layer portion. A wrapping direction of the thin metal wires of the inner layer portion is opposite to a wrapping direction of the metal resin tape of the outer layer portion. An angle in the wrapping direction of the metal resin tape with respect to the wrapping direction of the thin metal wires is in a range of 30° or more but 90° or less. A cross-talk between the coaxial wire pairs is equal to or less than −40 dB.

7 Claims, 4 Drawing Sheets

(51) Int. Cl.

| | |
|---|---|
| ***H01B 1/02*** | (2006.01) |
| ***H01B 3/44*** | (2006.01) |
| ***H01B 3/30*** | (2006.01) |
| ***H01B 11/20*** | (2006.01) |
| *H01B 7/18* | (2006.01) |
| *H01B 11/18* | (2006.01) |

(56) References Cited

U.S. PATENT DOCUMENTS 3,639,674 A * 2/1972 Stier ........................ H01B 9/02 174/102 R
3,651,243 A * 3/1972 Hornor .................. H01B 11/20 174/103
4,164,621 A * 8/1979 Silva .................... H02G 15/105 156/49
4,552,989 A * 11/1985 Sass ................... H01B 11/1834 174/103
4,847,448 A * 7/1989 Sato ................... H01B 11/1817 174/103
4,963,695 A * 10/1990 Marciano-Agostinelli ................ B29C 47/0016 156/48
5,077,526 A * 12/1991 Vokey .................. G01R 31/021 324/541
6,750,399 B1 * 6/2004 Daumling ................ H01B 7/30 174/102 R
7,135,641 B2 * 11/2006 Clark ..................... H01B 7/184 174/110 R
7,332,676 B2 * 2/2008 Sparrowhawk .... H01B 11/1008 174/102 R
2004/0074654 A1 * 4/2004 Springer ............ H01B 11/1847 174/28
2004/0102329 A1 * 5/2004 Mele ...................... H01B 12/06 505/100
2006/0137893 A1 * 6/2006 Sumi .................... H01R 24/562 174/84 R
2010/0280584 A1 * 11/2010 Johnson ................. A61B 5/415 607/116
2011/0139485 A1 * 6/2011 Matsuda .............. H01B 11/002 174/102 R
2011/0247856 A1 * 10/2011 Matsuda .............. H01B 11/203 174/108
2013/0333917 A1 * 12/2013 Tanabe ................... H01B 7/048 174/113 R
2013/0341065 A1 * 12/2013 Sato ................... H01B 11/1895 174/107

* cited by examiner

MULTI-CORE CABLE

CROSS-REFERENCE TO RELATED APPLICATION

The present application claims priority from Japanese Patent Application No. 2015-089348 filed on Apr. 24, 2015, the entire content of which is incorporated herein by reference.

BACKGROUND

Technical Field

The present invention relates to a multi-core cable having a plurality of coaxial wires.

Related Art

Patent Document 1 discloses a coaxial cable which has a center conductor, a dielectric layer, an outer conductor layer and a jacket. A tape layer is provided between the outer conductor layer and the jacket. The tape layer is wrapped around the outer conductor layer at a predetermined angle with respect to a longitudinal axis direction of the coaxial cable.

Patent Document 1: Japanese Patent Laid-Open Publication No. 2008-171778

In a multi-core cable having a plurality of coaxial cables as disclosed in Patent Document 1, it is required to suppress the cross-talk between the coaxial cables to the minimum.

SUMMARY

Exemplary embodiments of the invention provide a multi-core cable capable of suppressing the cross-talk between coaxial wire pairs.

A multi-core cable according to an exemplary embodiment, comprises:

at least two coaxial wire pairs, each of the coaxial wire pairs including two coaxial wires being arranged side by side in contact with each other, each of the coaxial wires including a center conductor, an insulator, an outer conductor and a jacket, the outer conductor including an inner layer portion formed by thin metal wires being helically wrapped, and an outer layer portion formed by a metal resin tape being helically wrapped around the inner layer portion, wherein a wrapping direction of the thin metal wires of the inner layer portion is opposite to a wrapping direction of the metal resin tape of the outer layer portion, an angle in the wrapping direction of the metal resin tape with respect to the wrapping direction of the thin metal wires is in a range of 30° or more but 90° or less, and a cross-talk between the coaxial wire pairs is equal to or less than −40 dB.

According to the present invention, it is possible to provide a multi-core cable capable of suppressing the cross-talk between coaxial wire pairs.

DETAILED DESCRIPTION

Explanation of Embodiment of Present Invention

Figure 1:
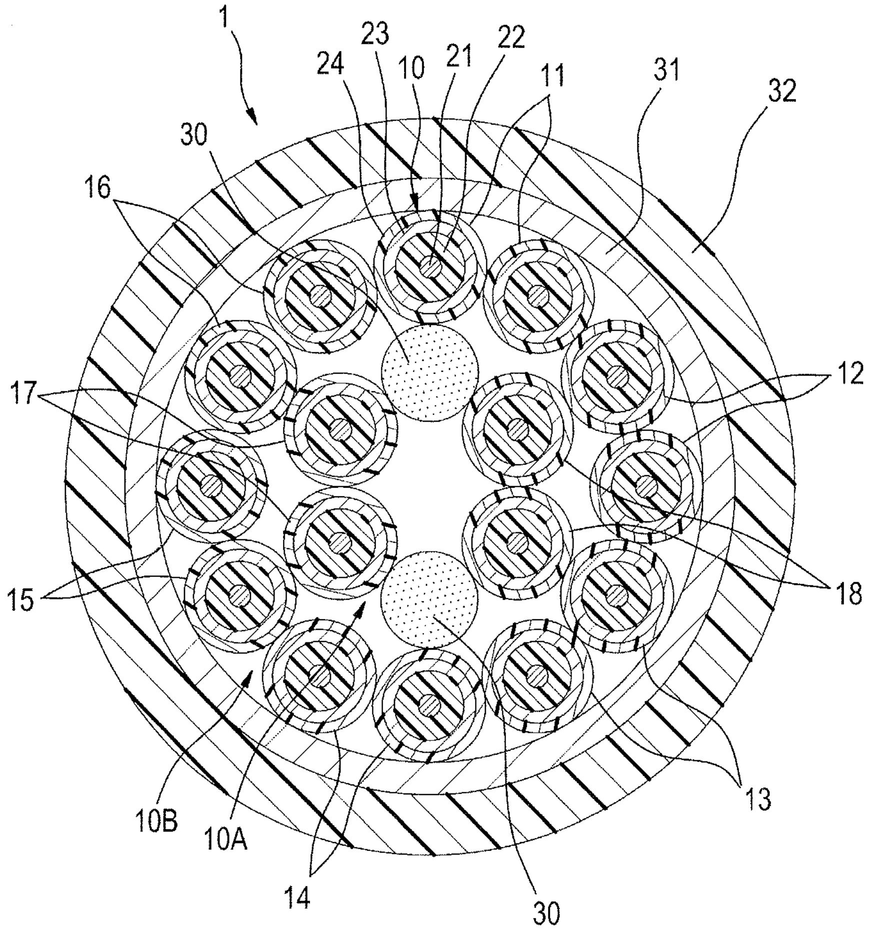
FIG. 1 is a sectional view showing an example of a multi-core cable according to an embodiment of the present invention.

First, contents of an embodiment of the present invention will be listed and described.

(1) A multi-core cable according to the embodiment of the present invention includes at least two coaxial wire pairs. Each of the coaxial wire pairs includes two coaxial wires being arranged side by side in contact with each other. Each of coaxial wires includes a center conductor, an insulator, an outer conductor and a jacket. The outer conductor includes an inner layer portion formed by thin metal wires being helically wrapped, and an outer layer portion formed by a metal resin tape being helically wrapped around the inner layer portion. A wrapping direction of the thin metal wires of the inner layer portion is opposite to a wrapping direction of the metal resin tape of the outer layer portion. An angle in the wrapping direction of the metal resin tape with respect to the wrapping direction of the thin metal wires is in a range of 30° or more but 90° or less. A cross-talk between the coaxial wire pairs is equal to or less than −40 dB. According to this configuration, it is possible to provide a multi-core cable capable of suppressing the cross-talk between coaxial wire pairs. The angle in the wrapping direction of the metal resin tape with respect to the wrapping direction of the thin metal wires is preferably in a range of 40° or more but 90° or less.

(2) Preferably, an angle in the wrapping direction of the thin metal wires with respect to a central axis of the coaxial wire is in a range of 5° or more but 15° or less. When the angle in the wrapping direction of the thin metal wires is set in the above range, an increase in the attenuation amount in a single coaxial wire can be sufficiently suppressed.

(3) Preferably, an angle in the wrapping direction of the metal resin tape with respect to a central axis of the coaxial wire is in a range of 25° or more but 85° or less. When the angle in the wrapping direction of the metal resin tape is less than 25° or greater than 85°, it is difficult to obtain an effect of suppressing the cross-talk.

(4) Preferably, an angle in the wrapping direction of the metal resin tape with respect to a central axis of the coaxial wire is in a range of 25° or more but 60° or less. From the viewpoint of wrapping easiness (productivity) at the time of wrapping the metal resin tape around the thin metal wires or bending easiness of the coaxial wire, it is desirable to set the angle in the wrapping direction of the metal resin tape to 60° or less.

(5) Preferably, in a cross section perpendicular to a longitudinal direction of the multi-core cable, the multi-core cable comprises a first layer which is formed by some of the plurality of coaxial wires being arranged on a circumference, and a second layer which is formed by a plurality of coaxial wires being different from the some coaxial wires of the first layer and arranged on another circumference around the first layer. Two coaxial wires constituting one coaxial wire pair are arranged at the same layer of the first layer or the second layer. When two coaxial wires constituting one coaxial wire pair are arranged at the same layer, it is possible to prevent the increase of the skew in the coaxial wire pair.

(6) Preferably, only the plurality of coaxial wires each having the same outer diameter is accommodated in the multi-core cable, or only the plurality of coaxial wires each having the same outer diameter and at least one filler are accommodated in the multi-core cable. According to this construction, a positional relationship among the coaxial wires arranged in the multi-core cable can be stably arranged without being deviated.

(7) Preferably, a tape is wrapped between the first layer and the second layer. According to this configuration, it is possible to prevent the increase of the skew due to drop of a coaxial wire arranged in the second layer to the first layer side.

Detail of Embodiment of Present Invention

Hereinafter, an example of an embodiment of a multi-core cable according to the present invention will be described with reference to the drawings. As shown in FIG. 1, a multi-core cable 1 according to the present embodiment has a plurality of coaxial wires 10 and filler cords 30. The plurality of coaxial wires 10 are set by being wholly stranded in a helical shape together with the filler cords 30. A periphery of the plurality of coaxial wires 10 is covered with a shield layer 31. A periphery of the shield layer 31 is covered with a sheath 32.

In order to be suitable for differential transmission applications, the coaxial wires 10 are accommodated in pairs in the multi-core cable 1 of the present embodiment. In the present embodiment, a pair of coaxial wires 10 constitutes a coaxial wire pair and, for example, eight coaxial wire pairs 11 to 18 are accommodated in the multi-core cable 1. Two coaxial wires 10 (e.g., the coaxial wires 10 of the coaxial wire pair 11) constituting respective pairs are arranged side by side in contact with each other. Meanwhile, it is desirable that the coaxial wires 10 constituting a pair are not twisted to each other.

The multi-core cable 1 has two filler cords 30, in addition to the eight coaxial wire pairs 11 to 18. Each of the filler cords 30 is a linear member which is formed of, for example, a material such as nylon, polypropylene and staple fiber and has a circular section. The filler cords 30 are disposed to stabilize positional relationship among the coaxial wire pairs 11 to 18 which are configured by a plurality of coaxial wires 10. Therefore, for example, the filler cords 30 may have a diameter slightly smaller than that of the coaxial wire 10 as shown in FIG. 1 or may have a diameter equal to or greater than that of the coaxial wire 10.

As shown in FIG. 1, in a cross section perpendicular to a longitudinal direction of the multi-core cable 1, two coaxial wire pairs 17, 18 of the eight coaxial wire pairs 11 to 18 and the filler cords 30 are arranged a circumference closer to the center of the cable, thereby forming a first layer 10A. Further, remaining six coaxial wire pairs 11 to 16 are arranged on another circumference around the first layer 10A, thereby forming a second layer 10B. The six coaxial wire pairs 11 to 16 are configured by the coaxial wires 10 different from the coaxial wires 10 constituting the coaxial wire pairs 17, 18. In other words, the coaxial wires 10 included in each of the coaxial wire pairs 11 to 18 are arranged only at one same layer of the first layer 10A or the second layer 10B. Further, the coaxial wires 10 included in the same coaxial wire pair are not separately arranged at the first layer 10A and the second layer 10B. The reason is that a skew (a difference in delay time due to a variation in delay time of the coaxial wires 10) in the coaxial wire pair is increased when the coaxial wires 10 included in the same coaxial wire pair are separately arranged at the first layer 10A and the second layer 10B. Therefore, in the present embodiment, two coaxial wires 10 constituting each of the coaxial wire pairs 11 to 18 are arranged only at one same layer of the first layer 10A or the second layer 10B. In this way, it is possible to prevent the increase of the skew in each of the coaxial wire pairs.

Further, when, as in the present embodiment, eight coaxial wire pairs 11 to 18 configured by sixteen coaxial wires 10 are arranged in the multi-core cable 1, four coaxial wires 10 and two filler cords 30 are together arranged at the first layer 10A (an inner layer side) on at circumference and twelve coaxial wires 10 are arranged at the second layer 10B around the first layer 10A. In this case, a positional relationship among the coaxial wires 10 accommodated in the multi-core cable 1 is stably arranged without being deviated. Further, by arranging the coaxial wires in this way, the skew is reduced to 8 ps/m or less when the differential transmission is performed in the coaxial wire pairs 11 to 18.

Figure 2:
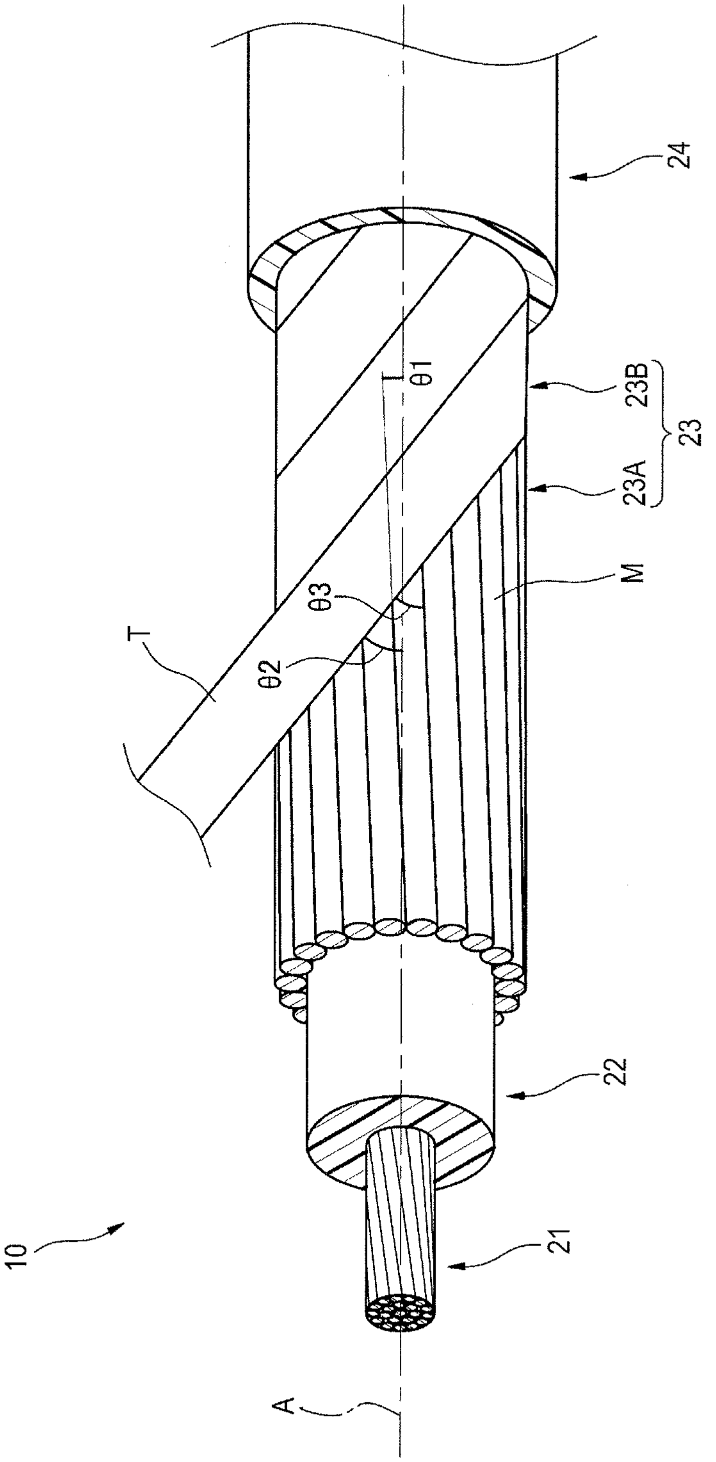
FIG. 2 is a perspective view showing an example of a coaxial wire included in the multi-core cable shown in FIG. 1.

As shown in FIGS. 1 and 2, each coaxial wire 10 has a coaxial structure that a center conductor 21 is covered with an insulator 22, an outer conductor 23 is arranged at an outer periphery of the insulator 22 and a periphery of the outer conductor 23 is covered with a jacket 24.

As the center conductor 21, a stranded wire configured by a plurality of thin metal wires being stranded is used. The thin metal wires have high conductivity enough to transmit electronic signals. An annealed copper wire or a copper alloy wire can be used as the thin metal wires. A copper or copper alloy being plated with other metal may be used. In the present embodiment, a stranded wire configured by seven silver-plated annealed copper wires can be used as the center conductor 21. An outer diameter of the center conductor 21 made of a stranded wire is, for example, 0.12 to 0.048 mm (AWG 34 to 46).

The insulator 22 includes, for example, a fluorocarbon resin made of tetrafluoroethylene-hexafluoropropylene copolymer (FEP) or tetrafluoroethylene-ethylene copolymer (ETFE), a polyolefin resin made of polyethylene, polypropylene or EVA or the like, a polyvinyl chloride or a polymethylpentene. The insulator 22 is formed by extruding and coating the aforementioned resin material around the center conductor 21.

The outer conductor 23 includes an inner layer portion 23A and an outer layer portion 23B provided around the inner layer portion 23A. The inner layer portion 23A is formed by thin metal wires M being helically wrapped around the insulator 22. For example, the thin metal wires M have an outer diameter of 0.1 to 0.02 mm and are annealed copper wires, tin-plated annealed copper wires, tin-plated copper alloy wires or silver-plated copper alloy wires, or the like. In the inner layer portion 23A, the thin metal wires M are helically wrapped around the insulator 22 at a predetermined angle θ1 with respect to a central axis A along a longitudinal direction of the coaxial wire 10. The angle θ1 between a wrapping direction of the thin metal wires M and the central axis A of the coaxial wire 10 is a minor angle. The angle θ1 is in the range of 5° or more but 15° or less, for example, 10°. When the wrapping direction of the thin metal wires M is set to make the angle θ1 of a degree in the range of 5° or more but 15° or less with respect to the central axis A, it is possible to suppress an increase of the attenuation amount in a single coaxial wire 10.

The outer layer portion 23B is made of a metal resin tape T being helically wrapped around the inner layer portion 23A. The metal resin tape T is made by laminating and bonding a metal foil such as a copper foil or an aluminum foil to a resin tape, and a thickness thereof is, for example, 0.1 to 12 μm. The metal resin tape T of the outer layer portion 23B is helically wrapped around the thin metal wires M at a predetermined angle θ2 with respect to the central axis A of the coaxial wire 10 such that a wrapping direction of the metal resin tape is opposite to the wrapping direction of the thin metal wires M of the inner layer portion 23A. The angle θ2 in the wrapping direction of the metal resin tape T with respect to the central axis A of the coaxial wire 10 is a minor angle. The angle θ2 is in the range of 25° or more but 85° or less, preferably, in the range of 25° or more but 60° or less. When the angle θ2 in the wrapping direction of the metal resin tape T is less than 25° or greater than 85°, it is difficult to obtain an effect of suppressing the cross-talk between any two pairs among the coaxial wire pairs 11 to 18. Further, from the viewpoint of wrapping easiness (productivity) at the time of wrapping the metal resin tape T around the thin metal wires M or bending easiness of the coaxial wire 10, it is desirable to set the angle θ2 in the wrapping direction of the metal resin tape T to 60° or less.

When the angles θ1 and θ2 are set to the above range, an angle θ3 between the wrapping direction of the metal resin tape T and the wrapping direction of the thin metal wires M can be set in the range of 30° or more but 90° or less, preferably, 30° or more but 60° or less, more preferably, 33° or more but 60° or less. The angle θ3 can be set in the range of 40° or more but 90° or less. Meanwhile, in the present embodiment, an angle between the thin metal wires M and the metal resin tape T is assumed to be a minor angle. When the angle θ3 between the wrapping direction of the metal resin tape T and the wrapping direction of the thin metal wires M is set to the range of 30° or more but 90° or less, it is possible to suppress the cross-talk between any two pairs among the coaxial wire pairs 11 to 18 to −40 dB or less.

The jacket 24 is formed by a resin tape made of polyethylene terephthalate (PET) being wrapped around the outer layer portion 23B of the outer conductor 23, for example. As the jacket 24, a fluorocarbon resin, a polyolefin resin or a polyvinyl chloride may be extruded and coated.

A periphery of six coaxial wire pairs 11 to 16 arranged in the second layer 10B, out of the eight coaxial wire pairs 11 to 18 set in this way, is covered with the shield layer 31. Further, an outer peripheral side of the shield layer 31 is covered with sheath 32.

The shield layer 31 is, for example, a braid of a tin-plated copper wire or a copper alloy wire having an outer diameter of several ten μm. Since the shield layer 31 prevents noise from being carried on the signals propagated along the coaxial wires 10 of the coaxial wire pairs 11 to 18, accurate signal transmission where there is no error due to the influence of noise can be realized. Further, the sheath 32 is formed of a polyvinyl chloride (PVC) or a polyolefin resin, or the like.

In order to manufacture the multi-core cable 1 of the present embodiment, first, near the center of the multi-core cable 1 in the cross section, the coaxial wire pairs 17, 18 each of which consists of two coaxial wires 10 being arranged side by side in contact with each other and two filler cords 30 are arranged on the same circumference in close proximity to each other. At this time, the filler cords 30 are respectively arranged between the coaxial wire pair 17 and the coaxial wire pair 18; thereby forming the first layer 10A. Then, remaining six coaxial wire pairs 11 to 16 each of which consists of two coaxial wires 10 being arranged side by side in contact with each other are arranged on another circumference around the first layer 10A (the coaxial wire pairs 17, 18 and the filler cords 30), thereby forming the second layer 10B. Then, the eight coaxial wire pairs 11 to 18 and the filler cords 30 arranged in this way are set by being wholly stranded in a helical shape. Alternatively, the coaxial wires 10 arranged in the first layer 10A and the coaxial wires 10 arranged in the second layer 10B may be separately stranded. In this case, a tape (not shown) may be wrapped on the first layer 10A and under the second layer 10B in order to prevent the increase of the skew due to the drop of the coaxial wires 10 arranged in the second layer 10B to the first layer 10A side. Subsequently, the shield layer 31 is formed around the coaxial wire pairs 11 to 18 set in this way. Finally, the sheath 32 is extruded and coated on an outer periphery of the shield layer 31.

EXAMPLE

Figure 3:
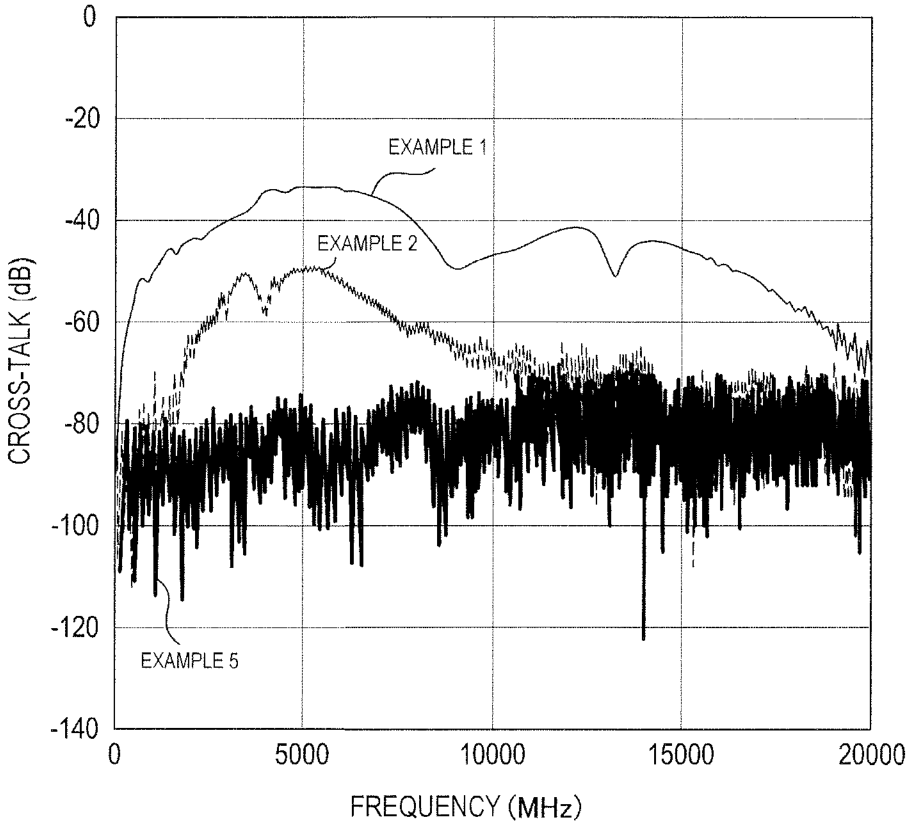
FIG. 3 is a graph showing evaluation results of the cross-talk for the multi-core cable shown in FIG. 1.
Figure 4:
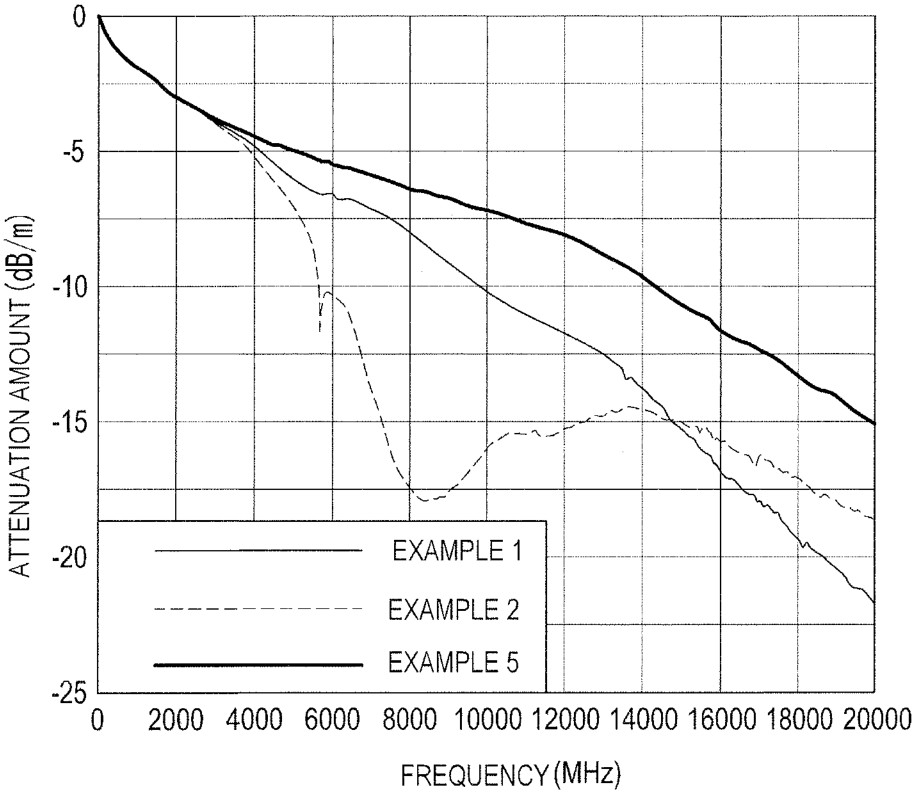
FIG. 4 is a graph showing evaluation results of the attenuation amount for the multi-core cable shown in FIG. 1.

In the multi-core cable 1 described above, the influence of the cross-talk and the attenuation amount due to the presence or absence of the metal resin tape T constituting the outer conductor 23 of the coaxial wire 10 or the change of the angle θ3 between the wrapping direction of the metal resin tape T and the wrapping direction of the thin metal wires M was evaluated. Specifically, the cross-talk, the attenuation amount and the suck-out were evaluated for the coaxial wires of examples 1 to 12 indicated in table 1. The results are shown in table 1. Further, the evaluation results of the cross-talk for the coaxial wires of examples 1, 2 and 5 are shown in FIG. 3 and the evaluation results of the attenuation amount for the coaxial wires of examples 1, 2 and 5 are shown in FIG. 4. As the coaxial wires, a wire having a size of AWG 32 (a sectional area of the center conductor is 0.0324 $mm^2$) and having a characteristic impedance of 45Ω was used.

Example 1 represents a coaxial wire in which a metal resin tape is not wrapped around thin metal wires helically wrapped and a periphery of the thin metal wires is directly covered with a jacket. Example 2 represents a coaxial wire in which the metal resin tape is wrapped in the same wrapping direction as the thin metal wires such that the angle θ3 of the metal resin tape with respect to the thin metal wires is 7° (angle θ1 is 10° and angle θ2 is 17°). Example 3 represents a coaxial wire in which the metal resin tape is wrapped in the same wrapping direction as the thin metal wires such that the angle θ3 of the metal resin tape with respect to the thin metal wires is 33° (angle θ1 is 10° and angle θ2 is 43°) which is greater than the angle θ3 in Example 2. Example 4 represents a coaxial wire in which the metal resin tape is wrapped in the wrapping direction opposite to the thin metal wires such that the angle θ3 of the metal resin tape with respect to the thin metal wires is 27° (angle θ1 is 10° and angle θ2 is 17°). Example 5 represents a coaxial wire in which the metal resin tape is wrapped in the wrapping direction opposite to the thin metal wires such that the angle θ3 of the metal resin tape with respect to the thin metal wires is 53° (angle θ1 is 10° and angle θ2 is 43°) which is greater than the angle θ3 in Example 4. In Examples 6 to 12, similarly, θ1, θ2 and θ3 are shown in Table 1.

TABLE 1

| Outer conductor | | Example 1 | Example 2 | Example 3 | Example 4 | Example 5 | Example 6 |
|---|---|---|---|---|---|---|---|
| Thin metal wire angle θ1 | | 10° | 10° | 10° | 10° | 10° | 15° |
| Metal resin tape | Wrapping direction | — | Same as thin metal wire | Same as thin metal wire | Opposite to thin metal wire | Opposite to thin metal wire | Opposite to thin metal wire |
| | Angle θ2 | — | 17° | 43° | 17° | 43° | 40° |
| | Angle θ3 | — | 7° | 33° | 27° | 53° | 55° |
| | Cross-talk | fail | pass | pass | good | good | good |
| | Attenuation amount | fail | fail | fail | fail | good | good |
| | Suck-out | good | fail | fail | fail | good | good |
| Diameter of an insulator | | 0.67 | 0.67 | 0.67 | 0.67 | 0.67 | 0.67 |
| Outer conductor | | Example 7 | Example 8 | Example 9 | Example 10 | Example 11 | Example 12 |
| Thin metal wire angle θ1 | | 15° | 10° | 8° | 10° | 8° | 5° |
| Metal resin tape | Wrapping direction | Opposite to thin metal wire | Opposite to thin metal wire | Opposite to thin metal wire | Opposite to thin metal wire | Opposite to thin metal wire | Opposite to thin metal wire |
| | Angle θ2 | 45° | 30° | 25° | 30° | 25° | 25° |
| | Angle θ3 | 60° | 40° | 33° | 40° | 33° | 30° |
| | Cross-talk | good | good | good | good | good | good |
| | Attenuation amount | good | good | good | good | good | good |
| | Suck-out | good | good | good | good | good | good |
| Diameter of an insulator | | 0.79 | 0.48 | 0.38 | 0.79 | 0.67 | 0.38 |

In the evaluation items shown in table 1, the cross-talk less than −60 dB was represented as "good", the cross-talk in the range of −60 dB or more but −40 dB or less was represented as "pass", and the cross-talk greater than −40 dB was represented as "fail". The attenuation amount in the range of −4.5 dB/m or less was represented as "good" and the attenuation amount greater than −4.5 dB/m was represented as "fail". Further, the suck-out was represented as "good" when it is not observed that the attenuation amount is abruptly dropped and improved after such drop in the range of 3 GHz to 15 GHz.

As shown in table 1, for the cross-talk, Example 1 was "fail" and Examples 2 and 3 were "pass". On the other hand, Examples 4 to 12 were "good". In Examples 4 to 12, the effect of suppressing the cross-talk was sufficient as compared to Examples 1 to 3. Particularly, as shown in a graph of FIG. 3, it can be seen that the cross-talk in Example 5 was suppressed to −60 dB or less in all frequency ranges. On the other hand, it was found that the cross-talk in Example 1 became greater than −60 dB in the frequency range of 1000 to 20000 MHz and became greater than −40 dB in the frequency range of 3000 to 10000 MHz. Further, it was found that the cross-talk in Example 2 became greater than −60 dB in the frequency range of 3000 to 10000 MHz.

Further, as shown in table 1, for the attenuation amount, Examples 1 to 4 were "fail" and Examples 5 to 12 were "good", and it can be seen that an increase in the attenuation amount was further suppressed (low attenuation is achieved even when the frequency is high) in Examples 5 to 12, as compared to Examples 1 to 4. Particularly, as shown in a graph of FIG. 4, it can be seen that Example 5 achieves low attenuation even when the frequency is high, as compared to Examples 1 and 2. Meanwhile, as shown in the graph of FIG. 4, in Example 2, a suck-out phenomenon where abrupt drop of attenuation occurs in the frequency range of 4000 to 14000 MHz was observed. However, the suck-out phenomenon did not occur in Examples 1 and 5.

From the foregoing, in Examples 5 to 12 where the metal resin tape is wrapped in the direction opposite to the thin metal wires such that the angle θ3 between the wrapping direction of the metal resin tape and the wrapping direction of the thin metal wires is not less than 30°, it was confirmed that good results were obtained in all of the evaluation items of the cross-talk, the attenuation amount and the suck-out. Meanwhile, the maximum of the angle θ3 is 90° (in the present embodiment, an angle between the thin metal wires and the metal resin tape is an minor angle or acute angle). In Example 8 and Example 10 where the angle θ1 is 10° and the angle θ2 (in the direction opposite to the angle θ1) is 30° (i.e., the angle θ3 was 40°), good results were obtained in all of the cross-talk, the attenuation amount and the suck-out. From these results, it was assumed that good results were obtained in all of the cross-talk, the attenuation amount and the suck-out when the angle θ3 is increased. A desirable value of the angle θ3 in the present embodiment was in the range of 30° or more but 90° or less, desirably, 30° or more but 60° or less, more desirably, 33° or more but 60° or less.

Although the present invention has been described in detail with reference to specific embodiments, various modifications and changes can be made without departing from the spirit and scope of the present invention.

The number and arrangement of the coaxial wires 10 and the filler cords 30 in the multi-core cable 1 of the above-described embodiment are not limited to the present embodiment. For example, the filler cords 30 may be omitted, so long as the arrangement relationship among the plurality of coaxial wires 10 in the multi-core cable 1 is stably held. Further, in the above-described embodiment, the metal resin tape T is configured by a copper foil or an aluminum foil or the like being bonded to a resin tape. However, the metal resin tape may be configured by a metallic material being deposited to a resin tape.

What is claimed is:

1. A multi-core cable comprising:

a plurality of coaxial wire pairs, each of the coaxial wire pairs including two coaxial wires being arranged side by side in contact with each other, each of the coaxial wires including a center conductor, an insulator, an outer conductor and a jacket, the outer conductor including an inner layer portion formed by thin metal wires being helically wrapped, and an outer layer portion formed by a metal resin tape being helically wrapped around the inner layer portion, wherein a wrapping direction of the thin metal wires of the inner layer portion is opposite to a wrapping direction of the metal resin tape of the outer layer portion, an angle in the wrapping direction of the metal resin tape with respect to the wrapping direction of the thin metal wires is in a range of 30° or more but 90° or less, a cross-talk between the coaxial wire pairs is equal to or less than −40 dB, and the multi-core cable further consisting of, in a cross section perpendicular to a longitudinal direction of the multi-core cable:

a first layer which is formed by some of the plurality of coaxial wire pairs being arranged on a circumference; and a second layer which is formed by the others of the plurality of coaxial wire pairs being different from the some coaxial wire pairs of the first layer and being arranged on another circumference around the first layer in a state that the adjacent coaxial wire pairs are in contact with each other and symmetrically to a line through a center of the cable, wherein two coaxial wires constituting one coaxial wire pair are arranged only at one same layer of the first layer or the second layer, and wherein the metal resin tape is configured by a metallic material being vapor deposited to a resin tape.

2. The multi-core cable according to claim 1, wherein the angle in the wrapping direction of the metal resin tape with respect to the wrapping direction of the thin metal wires is in a range of 40° or more but 90° or less.

3. The multi-core cable according to claim 1, wherein an angle in the wrapping direction of the thin metal wires with respect to a central axis of the coaxial wire is in a range of 5° or more but 15° or less.

4. The multi-core cable according to claim 1, wherein an angle in the wrapping direction of the metal resin tape with respect to a central axis of the coaxial wire is in a range of 25° or more but 85° or less.

5. The multi-core cable according to claim 1, wherein an angle in the wrapping direction of the metal resin tape with respect to a central axis of the coaxial wire is in a range of 25° or more but 60° or less.

6. The multi-core cable according to claim 1, wherein the plurality of coaxial wires each having the same outer diameter and at least one filler are accommodated in the first layer of the multi-core cable.

7. The multi-core cable according to claim 1, further comprising:

a tape wrapped between the first layer and the second layer.

* * * * *